(12) United States Patent
Low et al.

(10) Patent No.: US 6,984,831 B2
(45) Date of Patent: Jan. 10, 2006

(54) GAS FLOW RESTRICTING CATHODE SYSTEM FOR ION IMPLANTER AND RELATED METHOD

(75) Inventors: Russell J. Low, Rowley, MA (US);
Joseph C. Olson, Beverly, MA (US);
Curt D. Bergeron, Danvers, MA (US);
Eric R. Cobb, Danvers, MA (US);
Jeffrey A. Burgess, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/794,850

(22) Filed: Mar. 5, 2004

(65) Prior Publication Data

US 2005/0194550 A1   Sep. 8, 2005

(51) Int. Cl.
*H01J 37/08* (2006.01)

(52) U.S. Cl. ............................ 250/492.21; 250/423 R; 250/427; 315/111.81; 313/270; 313/310

(58) Field of Classification Search ............ 250/423 R, 250/427, 492.21; 315/111.81; 313/310, 313/270
See application file for complete search history.

(56) References Cited

U.S. PATENT DOCUMENTS 5,703,372 A    12/1997  Horsky et al.
6,777,686 B2 *  8/2004  Olson et al. ............ 250/423 R

FOREIGN PATENT DOCUMENTS

WO    WO 03/075305 A2    9/2003

* cited by examiner

*Primary Examiner*—Jack I. Berman

(57) ABSTRACT

A cathode system having a cathode element configured to extend through an aperture in a wall of an arc chamber of an ion implanter system. A gas flow through a spacing between the cathode element and the aperture is restricted by a restriction member. A method of ionizing a source gas and a cathode element incorporating the restriction member are also provided.

21 Claims, 7 Drawing Sheets

GAS FLOW RESTRICTING CATHODE SYSTEM FOR ION IMPLANTER AND RELATED METHOD

BACKGROUND OF THE INVENTION

1. Technical Field

The present invention relates generally to ion implanter systems. In particular, the invention relates to a gas conductance restricting cathode system for use in an ion implanter system.

2. Related Art

Ion implanter systems include a component referred to as a source, which generates an ion beam. An ion beam source receives a gas from a gas source and ionizes the gas into a plasma by exposing the gas to energetic electrons. The energetic electrons may be generated in a number of ways. One conventional approach to ionize the gas has been to directly expose the gas to a heated filament in an arc chamber. The heated filament may include, for example, tungsten. One problem with this approach, however, is that the filament has a relatively small mass and, accordingly, a short lifespan due to its direct exposure to the plasma.

In order to address this problem, indirect heated cathode (IHC) sources have been implemented in which a heated filament heats a cathode that is exposed to the gas. Referring to FIG. 1, typically, an IHC source 10 includes a relatively larger mass cathode element 12 that encloses a heated filament 14 and presents the cathode into an arc chamber 16 through an aperture 18 in the arc chamber wall 20. A filament energy supply 22 provides high current electricity to heat the filament 14 such that it emits electrons. A bias voltage is applied by a bias power supply 24 between cathode element 12 and filament 14 that propels the electrons to the cathode element. The energy transfer heats cathode element 12 such that electrons are emitted from cathode element 12 in arc chamber 16. An arc energy supply 26 places a voltage between the arc chamber 16 and cathode element 12, which pulls electrons from cathode element 12 to form a plasma (not shown) as the electrons impinge upon gas molecules provided by a source gas 34.

A spacing 28 must be present between an inner periphery 30 of aperture 18 and an outer periphery 32 of cathode element 12 to maintain a voltage gap. Spacing 28, inter alia, increases the gas required to operate the system and presents a gas leakage problem. One approach to address this problem has been to plug the spacing with an insulator that extends about the cathode element. Typically, however, the insulator cannot withstand the high temperatures generated by the cathode, and consequently generates off-gasses. The off-gas is highly undesirable because of its effect on the plasma and downstream components.

In another approach, as shown in FIG. 1, spacing 28 is simply left in place and gas allowed to leak through the spacing. Gas may leak, for example, at an increased flow rate of about 0.2 standard cubic centimeters per minute (sccm) compared to a system that does not use an IHC. Increased gas leakage can lead to coating of the high voltage system components and an increase high voltage break down, glitch rate and general ion beam instability. In addition, the increased gas flow rate increases coatings of all downstream components such as bushings and ceramics. As a result, more frequent cleaning of the system is required. All of the above-described issues affect the cost of operation and reliability.

In view of the foregoing, there is a need in the art for a cathode system that addresses the problems of the related art.

SUMMARY OF THE INVENTION

The invention includes a cathode system having a cathode element configured to extend through an aperture in a wall of an arc chamber of an ion implanter system. A gas flow through a spacing between the cathode element and the aperture is restricted by a restriction member. A method of ionizing a source gas and a cathode element incorporating the restriction member are also provided.

A first aspect of the invention is directed to a cathode system for use in a source of an ion implanter system, the cathode system comprising: a cathode element configured to extend through an aperture in a wall of an arc chamber of the ion implanter system, the cathode element and the aperture having a spacing therebetween; and a restriction member restricting a gas flow through the spacing.

A second aspect of the invention is directed to a cathode system for use in a source of an ion implanter system, the cathode system comprising: a cathode element configured to extend through an aperture in a wall of an arc chamber of the ion implanter system, the cathode element and the aperture having a spacing therebetween; a heated filament to heat the cathode element; and a flange restricting a gas flow through the spacing, the flange extending outwardly relative to an outer periphery of the cathode element to restrict the gas flow.

A third aspect of the invention is directed to a method for ionizing a source gas for an ion implanter system, the method comprising the steps of: providing a cathode element through an aperture in a wall of an arc chamber of the ion implanter system, the cathode element and the aperture having a spacing therebetween; introducing the source gas to the arc chamber; restricting a flow of the source gas through the spacing using a restriction member; and heating the cathode element to ionize the gas.

A fourth aspect of the invention is directed to a cathode element for use in a source of an ion implanter system in which the cathode element is configured to be positioned in an aperture in a wall of an arc chamber of the ion implanter system, the housing and the aperture having a spacing therebetween, the cathode element comprising: a restriction member configured to restrict a gas flow through the spacing.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
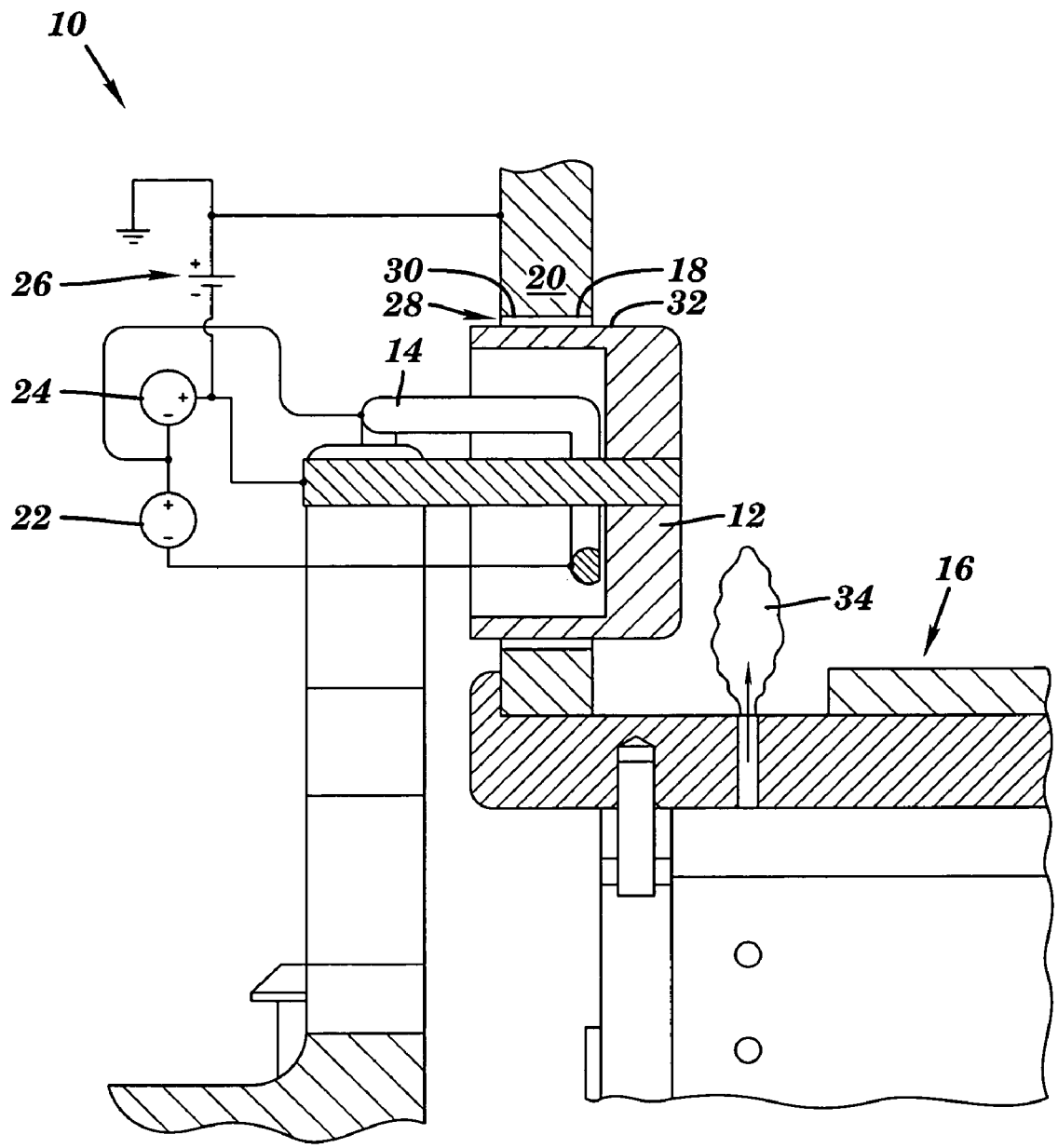
FIG. 1 shows a conventional indirect heated cathode for an ion implanter system.
Figure 2:
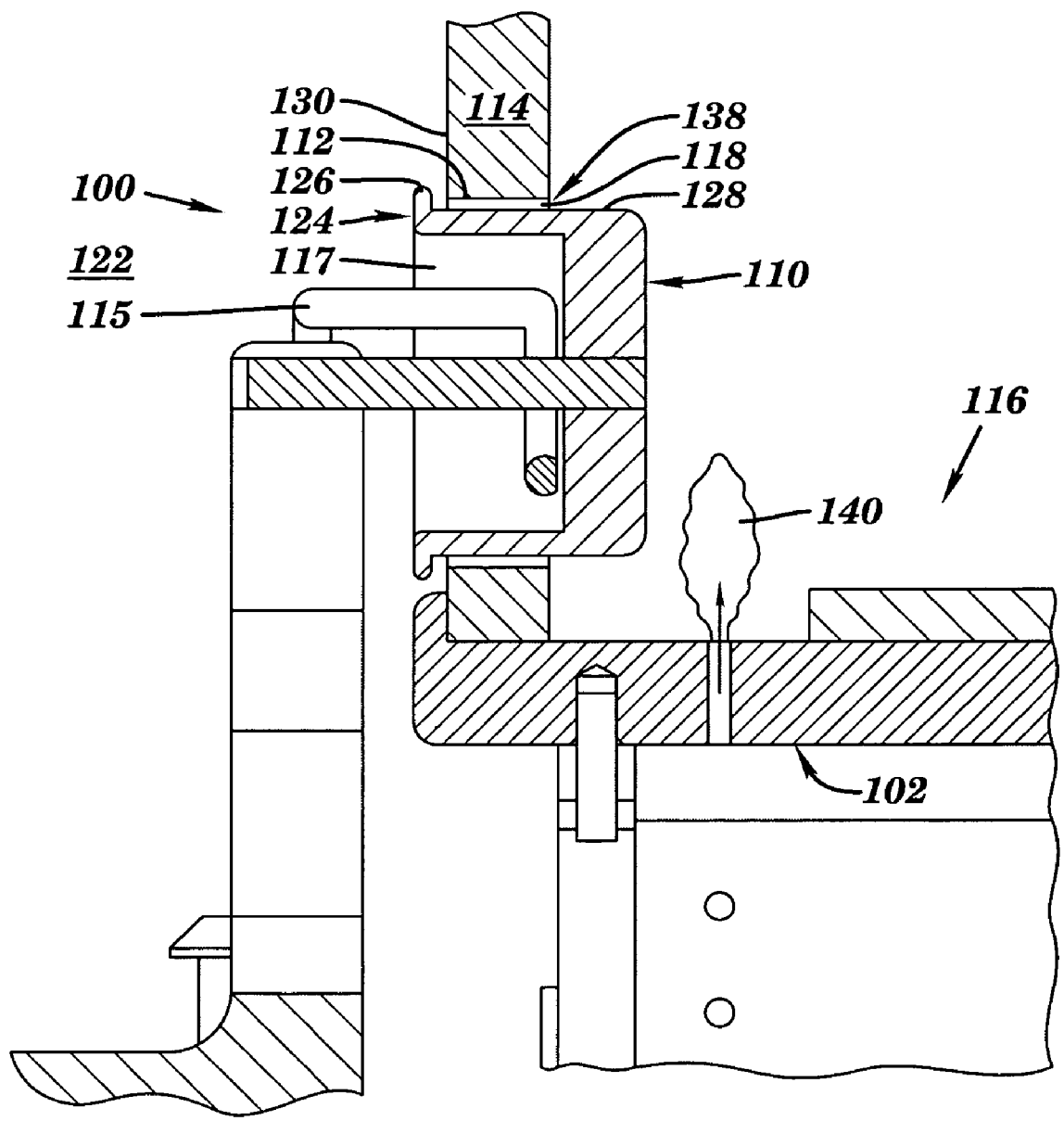
FIG. 2 shows a first embodiment of a cathode system according to the invention.

With reference to the accompanying drawings, FIG. 2 illustrates a cathode system 100 for use in a source 102 of an ion implanter system according to the invention. Cathode system 100 includes a cathode element 110 configured to extend through an aperture 112 in a wall 114 of an arc chamber 116 of the ion implanter system. A heated filament 115 is positioned adjacent cathode element 110 in a hollow area 117 of the element, i.e., filament 115 extends within hollow area 117. Power supplies that: heat filament 115, provide a bias voltage between filament 115 and cathode element 110, and provide an arc voltage between cathode element 110 and arc chamber 116, have been omitted for clarity. Heated filament 115 generates sufficient energy to emit electrons from a portion thereof, which are propelled against hollow area 117 of cathode element 110 by a bias voltage. As a result, cathode element 110 becomes hot until it reaches a point where it emits electrons into arc chamber 116. The electrons are drawn into arc chamber 116 by an arc voltage such that they form a plasma when they impinge on gas molecules supplied by a source gas 140. A spacing 118 exists between cathode element 110 and aperture 112 so as to maintain a voltage gap. A restriction member 124 is employed in order to restrict a gas flow from inside arc chamber 116 to an exterior 122 of arc chamber 116 through spacing 118.

Figure 3:
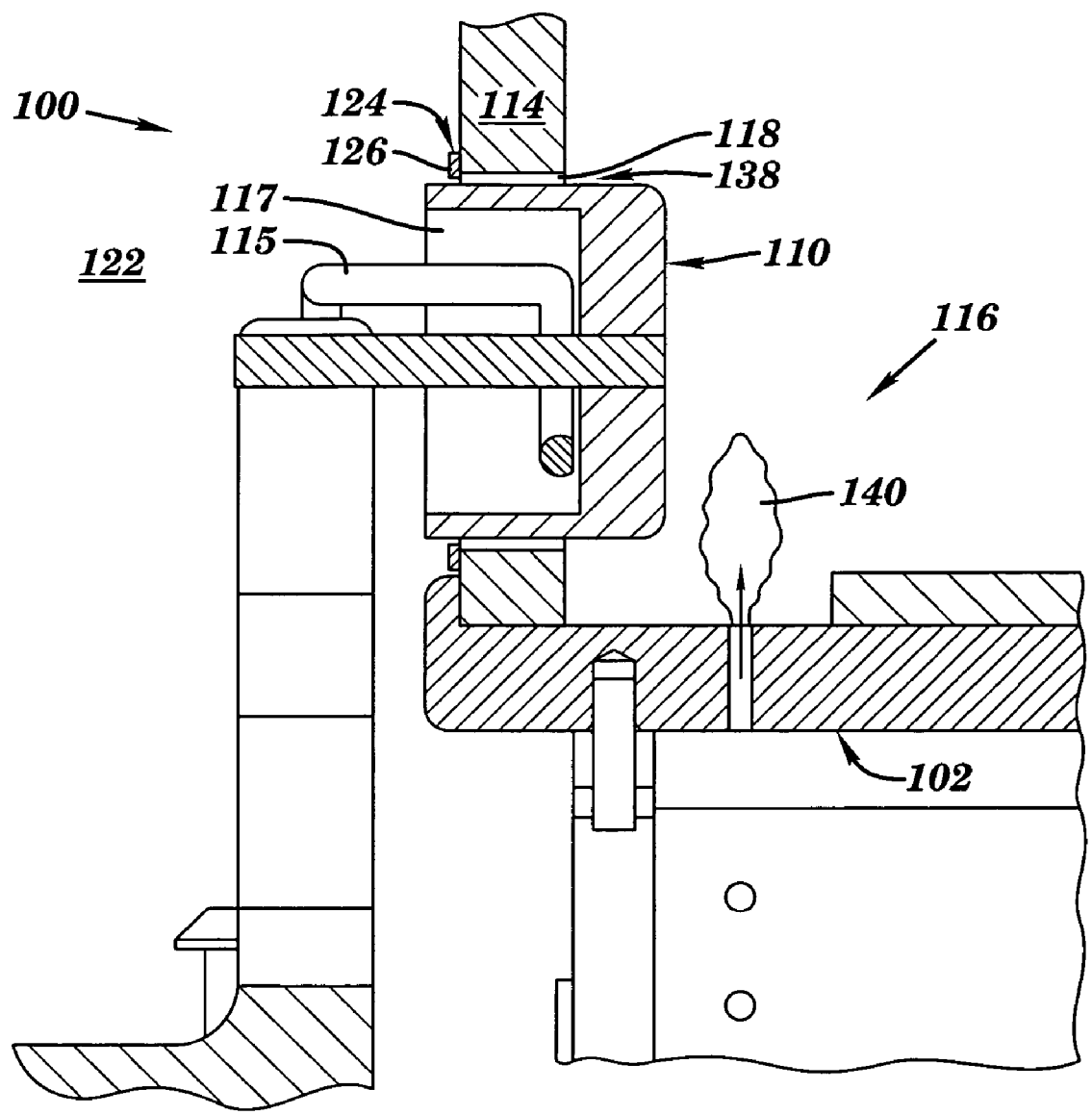
FIG. 3 shows a second embodiment of the cathode system.
Figure 4:
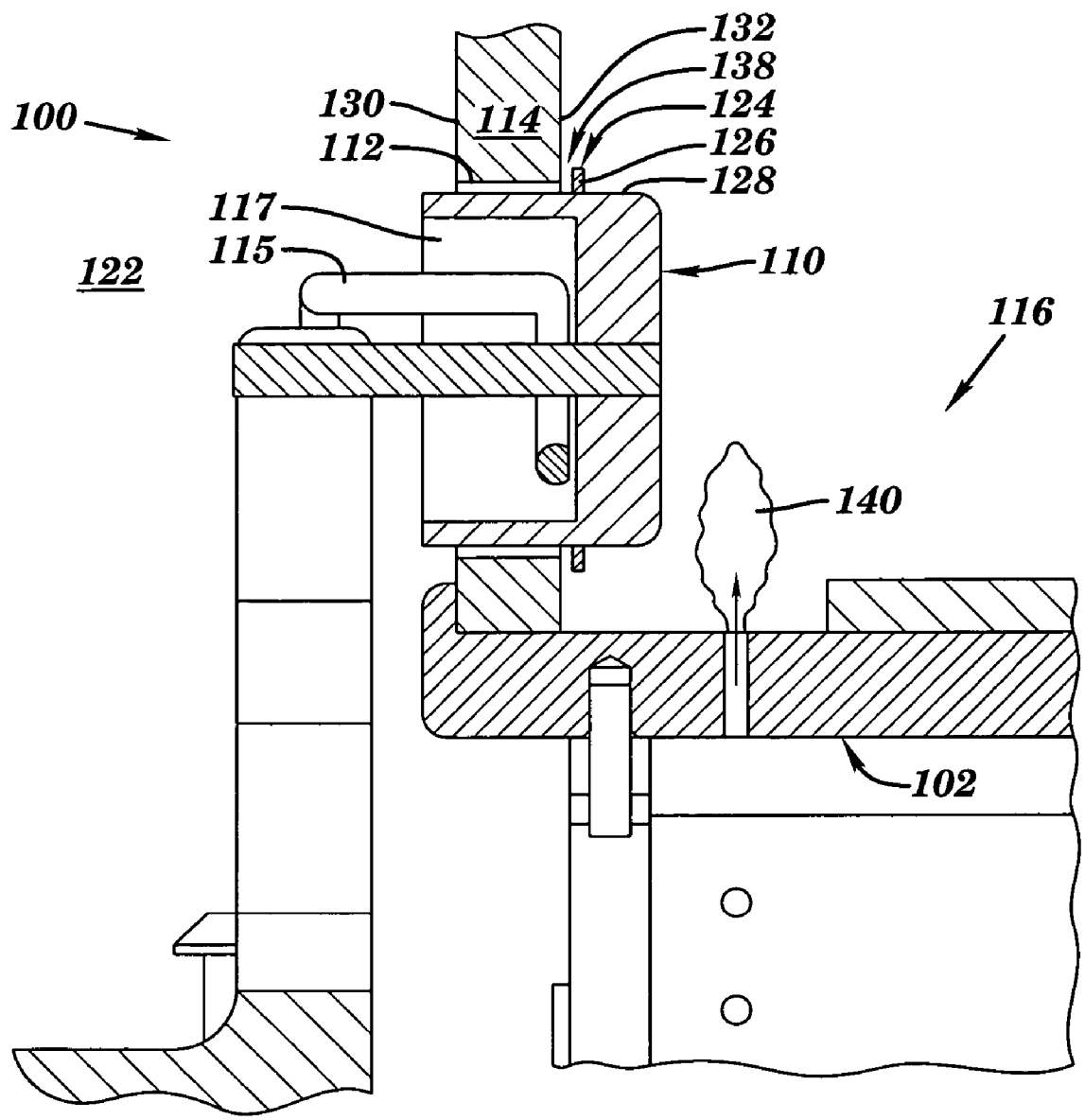
FIG. 4 shows a third embodiment of the cathode system.

In one embodiment, restriction member 124 provides a restricted pathway 138 via a flange 126. Flange 126, in one embodiment, extends from at least one of cathode element 110 (FIGS. 2 and 4) and wall 114 of arc chamber 116 (FIG. 3). See also FIG. 6. Flange 126 is positioned in such a way as to control the amount of gas flow through spacing 118, i.e., to act as a gas conductance limiter. That is, flange 126 is positioned relative to wall 114 and spacing 118 so as to restrict gas flow through spacing 118. As illustrated, wall 114 is perpendicular to an outer periphery 128 of cathode element 110. Wall 114 and cathode element 110 may be, for example, 0.02 to 0.04 inches apart. In this case, in one embodiment, flange 126 extends substantially perpendicular to an outer periphery 128 of cathode element 110, which is typically circular in cross-section. In cases where cathode element 110 and/or wall 114 are not perpendicular, flange 126 may extend substantially parallel to an exterior 130 of wall 114 of arc chamber 116 so as to restrict gas flow. As shown in FIG. 4, where restriction member 124 can be positioned within arc chamber 116, a flange 126 may extend substantially parallel to an interior 132 of wall 114. As shown in phantom in FIG. 6, the embodiments of FIGS. 2–4 may be selectively combined.

In one embodiment, restriction member 124 extends continuously about outer periphery 128 of cathode element 110. However, it may be necessary to make restriction member 124 non-continuous for optimization purposes. It should be recognized that restriction member 124 of FIGS. 2–4 may take any form necessary to restrict gas flow through spacing 118, i.e., it need not be a flange.

Figure 5A:
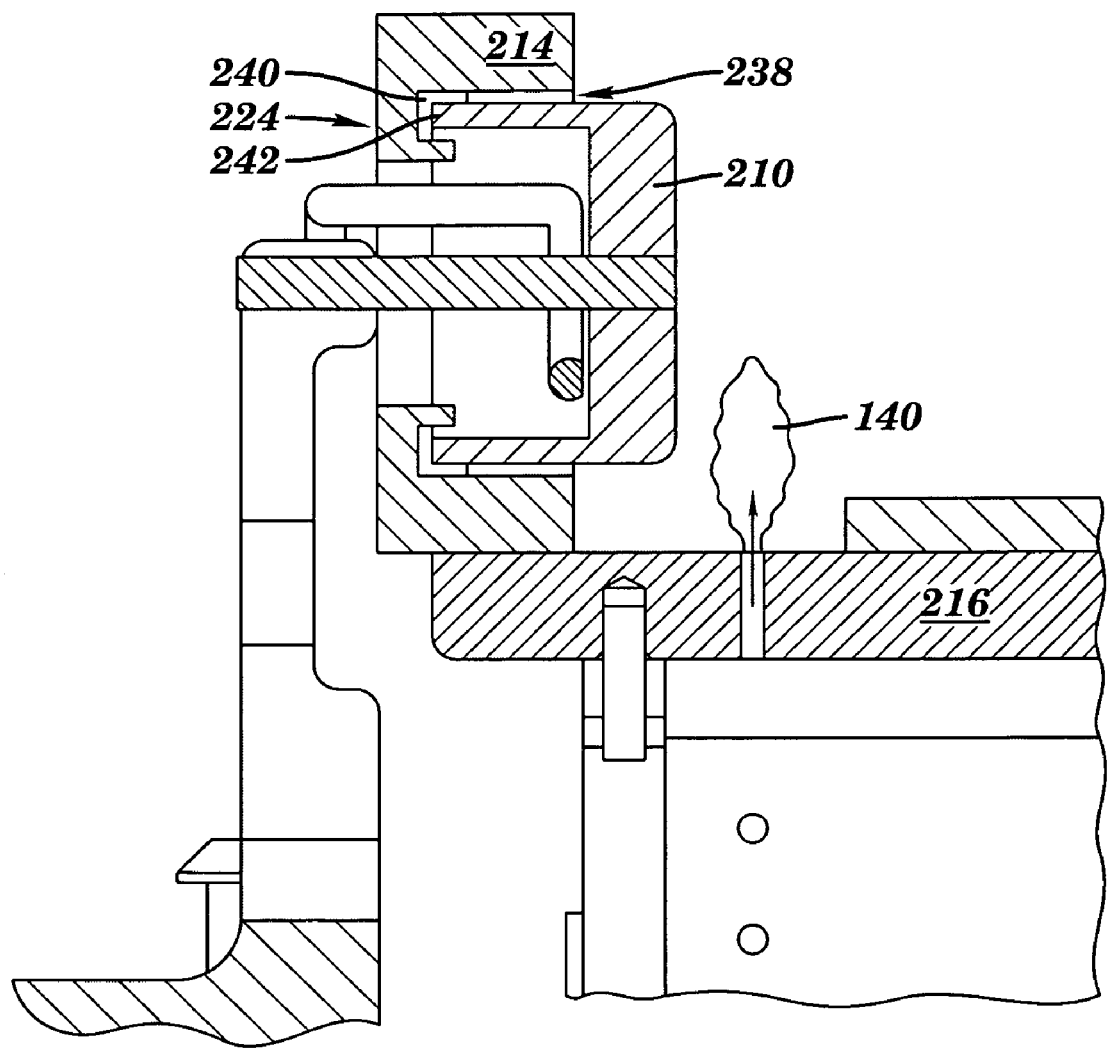
FIGS. 5A–5B show a fourth embodiment of the cathode system.
Figure 5B:
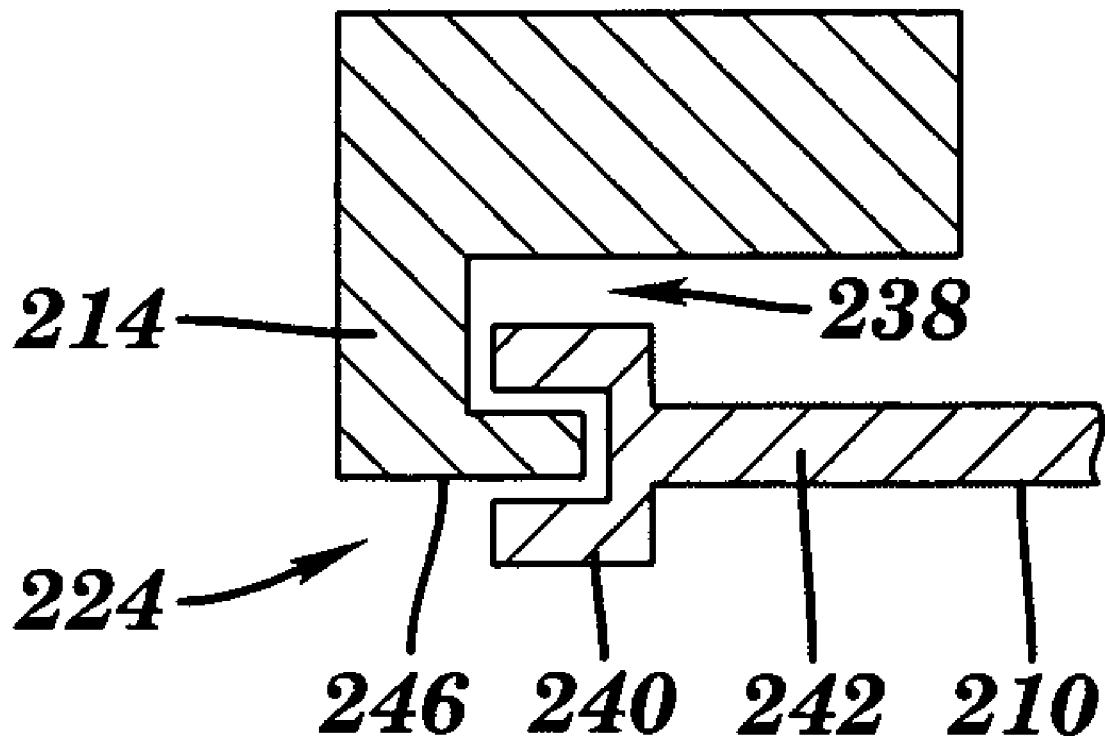
Figure 6:
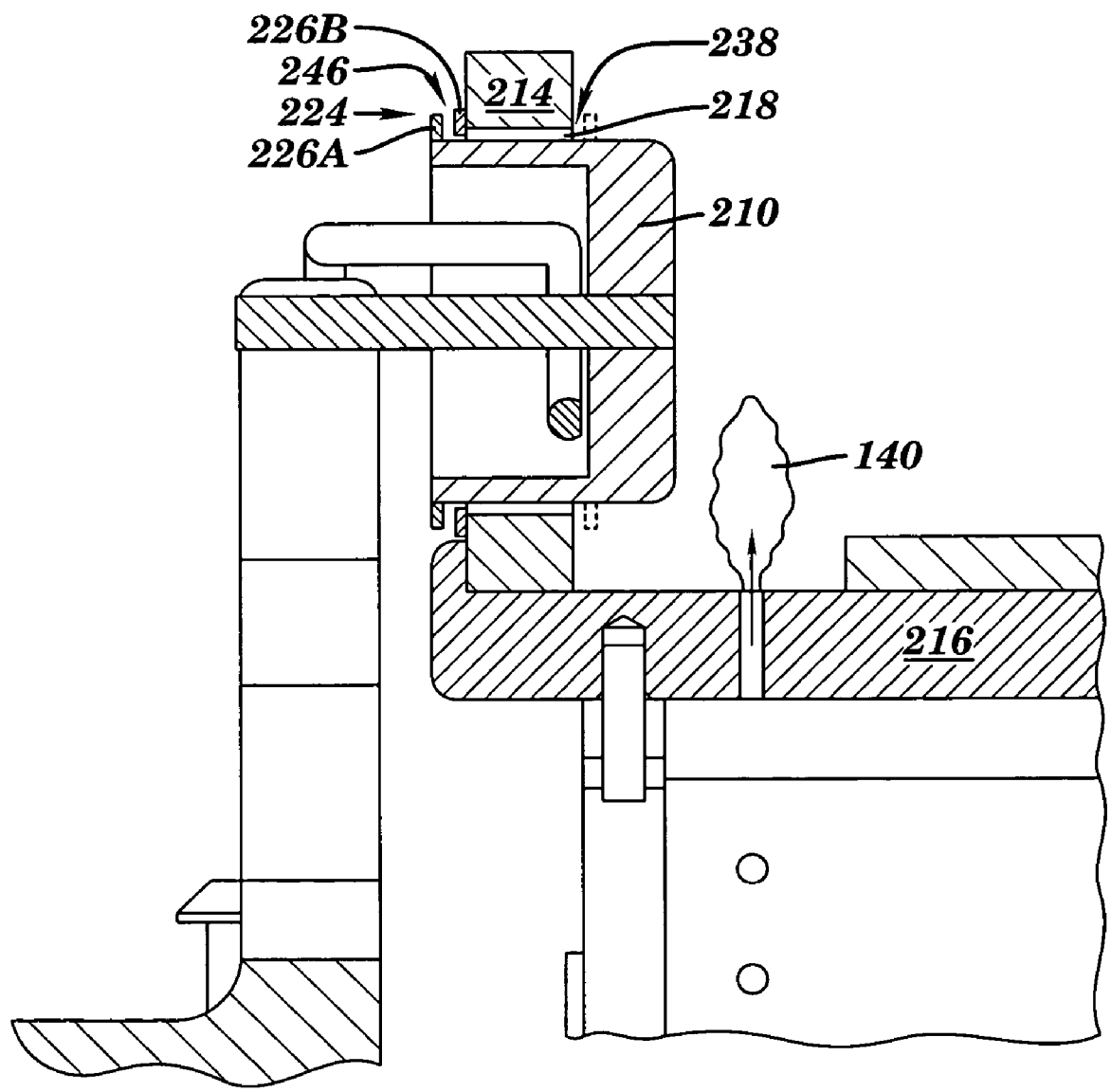
FIG. 6 shows a fifth embodiment of the cathode system.

Referring to FIGS. 5A–B and 6, alternative embodiments of the invention are illustrated. In these embodiments, a restriction member 224 provides a more restricted pathway 238 compared to restricted pathway 138 (FIGS. 2–4). In FIGS. 5A–5B, cathode element 210 includes one of a male and a female member thereon that is configured to receive a complimentary one of a female and a male member of the wall in a non-contacting fashion. In the FIG. 5A embodiment, restricted pathway 238 is formed by providing an arc chamber wall 214 with a female member (groove) 240 for receiving an end 242 (male member) of a cathode element 210 in a non-contacting fashion. FIG. 5B illustrates that the position of female member 240 may be provided on end 242 of cathode element 210, and a male member 246 may be formed by arc chamber wall 214. In either case, gas leakage is substantially restricted by the more restricted pathway 238 formed. In the FIG. 6 embodiment, restricted pathway 238 is formed by a flange 226A extending from cathode element 210 into spacing 218, and a flange 226B extending from wall 214 of arc chamber 216 into spacing 218. Restricted pathway 238, in this case, includes a substantially serpentine pathway portion 246 in which gas flow is restricted by being forced in multiple directions. It should be recognized that restricted pathway 238 may be formed in a variety of other ways, which are considered within the scope of the invention.

Implementing the above-described restriction member 124, 224 allows reduction in a gas flow rate through spacing 118, 218. For example, for a Varian Semiconductor Equipment Associates model VIISta 810 ion implanter system, the following reductions in gas flow (in standard cubic centimeter per minute) were observed: 1) boron+270 keV beam: reduction from 1.2 sccm to 0.8 sccm (33.33%); 2) phosphorous+270 keV beam: reduction from 1.2 sccm to 0.65 sccm (45.83%); 3) phosphorous++300 keV beam: reduction from 1.1 sccm to 0.7 sccm (36.33%); and phosphorous+++810 keV beam: reduction from 1.25 sccm to 0.6 sccm (52.00%). Accordingly, usage of restriction member 124, 224 has resulted in a gas flow of up to 0.8 sccm through spacing 118, 218 for that model. It should be recognized that the particular gas leakage reductions indicated above are only illustrative, and should not be considered limiting. Other values may occur depending on the ion implanter system used. For example, a larger ion implanter system may allow slightly more gas flow, e.g., up to 1.0 sccm, through spacing 118, 218.

In any of the above-described embodiments, adjustment of the relative positions of cathode element 110, 210 and arc chamber wall 114, 214 can be conducted to optimize the restriction of gas flow while maintaining an appropriate voltage gap. For example, referring to FIG. 5A, a position of end 242 relative to groove 240 can be adjusted. The actual adjustment may be made, for example, by any now known or later developed manner of positioning cathode element 110, 210.

The invention also includes a method for ionizing a source gas for an ion implanter system. In particular, the method includes providing a cathode element 110, 210 through an aperture 112 in a wall 114, 214 of an arc chamber 116, 216 of the ion implanter system with a spacing 118, 218. Next, a source gas 140 is introduced into arc chamber 116, 216. As this occurs, a flow of source gas 140 through spacing 118, 218 is restricted using restriction member 124, 224. Finally, the cathode element 110, 210 is heated to ionize the gas 140. It should be recognized that the order of the above-described steps may be altered and not depart from the scope of the invention.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A cathode system for use in a source of an ion implanter system, the cathode system comprising:
   a cathode element configured to extend through an aperture in a wall of an arc chamber of the ion implanter system, the cathode element and the aperture having a spacing therebetween; and
   a restriction member restricting a gas flow through the spacing, wherein the restriction member includes a flange extending from at least one of the cathode element and the wall of the arc chamber.

2. The cathode system of claim 1, wherein the flange extends substantially perpendicular to an outer periphery of the cathode element.

3. The cathode system of claim 1, wherein the flange extends substantially parallel to at least one of an interior of the wall of the arc chamber and an exterior of the wall of the arc chamber.

4. The cathode system of claim 1, wherein the restriction member includes a flange extending from the cathode element and the wall of the arc chamber.

5. The cathode system of claim 4, wherein the restriction member forms a substantially serpentine pathway portion.

6. A cathode system for use in a source of an ion implanter system, the cathode system comprising:
   a cathode element configured to extend through an aperture in a wall of an arc chamber of the ion implanter system, the cathode element and the aperture having a spacing therebetween; and
   a restriction member restricting a gas flow through the spacing, wherein the restriction member includes one of a male and a female member on the cathode element that is configured to receive a complimentary one of a female and a male member of the wall in a non-contacting fashion.

7. A cathode system for use in a source of an ion implanter system, the cathode system comprising:
   a cathode element configured to extend through an aperture in a wall of an arc chamber of the ion implanter system, the cathode element and the aperture having a spacing therebetween;
   a heated filament to heat the cathode element; and
   a flange restricting a gas flow through the spacing, the flange extending outwardly relative to an outer periphery of the cathode element to restrict the gas flow.

8. The cathode system of claim 7, wherein the flange extends substantially perpendicular relative to the outer periphery of the cathode element.

9. The cathode system of claim 7, wherein the flange extends substantially parallel to at least one of an interior of the wall of the arc chamber and an exterior of the wall of the arc chamber.

10. The cathode system of claim 7, wherein the restriction member includes one of a male and a female member on the cathode element that is configured to receive a complimentary one of a female and a male member of the wall in a non-contacting fashion.

11. The cathode system of claim 7, wherein the restriction member forms a substantially serpentine pathway portion.

12. A method for ionizing a source gas for an ion implanter system, the method comprising the steps of:
   providing a cathode element through an aperture in a wall of an arc chamber of the ion implanter system, the cathode element and the aperture having a spacing therebetween;
   introducing the source gas to the arc chamber;
   restricting a flow of the source gas through the spacing using a restriction member, wherein the restriction member includes a flange extending from at least one of the cathode element and the wall of the arc chamber; and
   heating the cathode element to ionize the gas.

13. The method of claim 12, wherein the flange extends substantially perpendicular to an outer periphery of the cathode element.

14. The method of claim 12, wherein the flange extend substantially parallel to one of an interior of the wall of the arc chamber and an exterior of the wall of the arc chamber.

15. A method for ionizing a source gas for an ion implanter system, the method comprising the steps of:
   providing a cathode element through an aperture in a wall of an arc chamber of the ion implanter system, the cathode element and the aperture having a spacing therebetween;
   introducing the source gas to the arc chamber;
   restricting a flow of the source gas through the spacing using a restriction member, wherein the restriction member includes one of a male and a female member on the cathode element that is configured to receive a complimentary one of a female and a male member of the wall in a non-contacting fashion; and
   heating the cathode element to ionize the gas.

16. A method for ionizing a source gas for an ion implanter system, the method comprising the steps of:
   providing a cathode element through an aperture in a wall of an arc chamber of the ion implanter system, the cathode element and the aperture having a spacing therebetween:
   introducing the source gas to the arc chamber;
   restricting a flow of the source gas through the spacing using a restriction member, wherein the restriction member forms a substantially serpentine pathway portion; and
   heating the cathode element to ionize the gas.

17. A cathode element for use in a source of an ion implanter system in which the cathode element is configured to be positioned in an aperture in a wall of an arc chamber of the ion implanter system, the housing and the aperture having a spacing therebetween, the cathode element comprising:
   a restriction member configured to restrict a gas flow through the spacing.

18. The cathode element of claim 17, wherein the restriction member includes a flange extending from the cathode element.

19. The cathode element of claim 18, wherein the flange extends substantially perpendicular to an outer periphery of the cathode element.

20. The cathode element of claim 17, wherein the restriction member includes one of a male and a female member on the cathode element that is configured to receive a complimentary one of a female and male member of the wall in a non-contacting fashion.

21. The cathode element of claim 17, wherein the restriction member forms a substantially serpentine pathway portion.

* * * * *